(12) United States Patent
Dong et al.

(10) Patent No.: US 9,583,669 B2
(45) Date of Patent: Feb. 28, 2017

(54) INKJET PRINTABLE ETCH RESIST

(75) Inventors: Hua Dong, Shrewsbury, MA (US); Robert K. Barr, Shrewsbury, MA (US)

(73) Assignee: Sun Chemical Corporation, Parsippany, NJ (US)

( * ) Notice: Subject to any disclaimer, the term of this patent is extended or adjusted under 35 U.S.C. 154(b) by 570 days.

(21) Appl. No.: 13/587,916

(22) Filed: Aug. 16, 2012

(65) Prior Publication Data

US 2014/0051248 A1 Feb. 20, 2014

(51) Int. Cl.
| | |
|---|---|
| *H01L 21/302* | (2006.01) |
| *H01L 21/461* | (2006.01) |
| *C03C 15/00* | (2006.01) |
| *C03C 25/68* | (2006.01) |
| *C23F 1/00* | (2006.01) |
| *H01L 31/18* | (2006.01) |
| *H01L 21/28* | (2006.01) |
| *H01L 21/027* | (2006.01) |
| *H01L 21/47* | (2006.01) |
| *H01L 21/3115* | (2006.01) |
| *H01L 21/02* | (2006.01) |
| *C08L 93/04* | (2006.01) |
| *C09D 11/08* | (2006.01) |
| *C09D 11/34* | (2014.01) |

(52) U.S. Cl.
CPC .......... *H01L 31/1804* (2013.01); *C08L 93/04* (2013.01); *C09D 11/08* (2013.01); *C09D 11/34* (2013.01); *H01L 21/0273* (2013.01); *H01L 21/02118* (2013.01); *H01L 21/2822* (2013.01); *H01L 21/31155* (2013.01); *H01L 21/47* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 5,531,819 | A | 7/1996 | Sawada |
| 5,624,483 | A | 4/1997 | Fujioka |
| 5,662,736 | A | 9/1997 | Sakai et al. |
| 5,669,965 | A | 9/1997 | Sawada et al. |
| 5,938,826 | A | 8/1999 | Baker et al. |
| 5,965,196 | A | 10/1999 | Sawada |
| 6,093,239 | A | 7/2000 | Baker et al. |
| 7,578,874 | B2 | 8/2009 | Benjamin et al. |
| 7,923,495 | B2 | 4/2011 | Yoshida |
| 2005/0233097 | A1 | 10/2005 | Tojo et al. |
| 2009/0308435 | A1* | 12/2009 | Caiger .......................... 136/252 |
| 2010/0104963 | A1* | 4/2010 | Carlini et al. .................. 430/56 |
| 2010/0129754 | A1* | 5/2010 | Cheetham et al. ........ 430/286.1 |
| 2011/0287634 | A1 | 11/2011 | Barr et al. |
| 2011/0303264 | A1 | 12/2011 | Taniguchi |
| 2012/0070992 | A1 | 3/2012 | Dong et al. |

FOREIGN PATENT DOCUMENTS

| | | |
|---|---|---|
| CN | 101277821 A | 10/2008 |
| CN | 101523616 A | 9/2009 |
| CN | 102280522 A | 12/2011 |

OTHER PUBLICATIONS

European Search Report issued in counterpart Application No. EP 13180594 dated Mar. 11, 2016.
Chinese Office Action issued in Chinese Application No. 20130485921.7, dated Jul. 4, 2016. (English Translation).

* cited by examiner

*Primary Examiner* — Stephanie Duclair
(74) *Attorney, Agent, or Firm* — Charles C. Achkar; Ostrolenk Faber LLP

(57) ABSTRACT

The methods involve selectively depositing a resist containing a solid hydrogenated rosin resin and a liquid hydrogenated rosin resin ester as a mixture on a semiconductor followed by etching uncoated portions of the semiconductor and simultaneously inhibiting undercutting of the resist. The etched portions may then be metallized to form current tracks.

6 Claims, No Drawings

INKJET PRINTABLE ETCH RESIST

FIELD OF THE INVENTION

The present invention is directed to inkjet printable etch resist with superior adhesion for forming current tracks on semiconductors. More specifically, the present invention is directed to inkjet printable etch resist with superior adhesion for forming current tracks on semiconductors where the inkjet printable etch resist includes a solid hydrogenated rosin resin in combination with a liquid hydrogenated rosin resin ester to inhibit undercutting during etching.

BACKGROUND OF THE INVENTION

The manufacture of semiconductor devices, such as photovoltaics and solar cells, involves the formation of electrically conductive contacts or current tracks on front and back sides of semiconductors. The metal coating must be able to establish ohmic contact with the semiconductor in order to ensure that charge carriers emerge from the semiconductor into the electrically conductive contacts without interference. In order to avoid current loss, metallized contact grids must have adequate current conductivities, i.e. a high conductivity or a sufficiently high conductor track cross section.

Numerous processes which meet the above requirements exist for metal coating the back side of solar cells. For example, in order to improve current conduction at the back side of solar cells, p-doping directly under the back side is reinforced. Usually aluminum is used for this purpose. The aluminum is applied, for example, by vapor deposition or by being printed onto the back side and being driven in or, respectively, alloyed in. Metal coatings using thick-film techniques are conventional methods for metallizing conductor tracks. Pastes used include metal particles and are electrically conductive as a result. The pastes are applied by screen, mask, pad printing or paste writing. A commonly used process is the screen printing process where finger-shaped metal coating lines having a minimum line width of 80 µm to 100 µm are made. Even at this grid width electrical conductivity losses are evident in comparison with a pure metal structure. This can have an adverse effect on the series resistance and on the filling factor and efficiency of the solar cell. This effect is intensified at smaller printed-on conductor track widths because the process causes the conductor tracks to become flatter. Nonconductive oxide and glass components between the metal particles constitute a fundamental cause of this reduced conductivity.

When metal coating the front sides, or light incidence sides, the objective is to achieve the least amount of shading of the active semiconductor surface in order to use as much of the surface as possible for capturing photons. Complex processes for producing the front side contacts make use of laser and other imaging techniques for the definition of the conductor track structures. The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

An anti-reflective layer is added to the front side or emitter layer of the wafer. In addition the anti-reflective layer may serve as a passivation layer. Suitable anti-reflective layers include silicon oxide layers such as $SiO_x$, silicon nitride layers such as $Si_3N_4$, or a combination of silicon oxide and silicon nitride layers. In the foregoing formulae, x is the number of oxygen atoms, typically x is the integer 2. Such anti-reflective layers may be deposited by a number of techniques, such as by various vapor deposition methods, for example, chemical vapor deposition and physical vapor deposition.

An opening or pattern is then defined on the front side. The pattern reaches through the antireflective layer to expose the surface of the semiconductor body of the wafer. A variety of processes may be used to form the pattern, such as, but not limited to, laser ablation, mechanical means, chemical and lithographic processes. Such mechanical means include sawing and scratching. Typical photolithographic processes include disposing an imageable material on the surface of the wafer, patterning the imageable material to form openings in the anti-reflective layer, transferring the pattern to the wafer, depositing a metal layer in the openings and removing the imageable material. An example of a chemical method of forming an opening on the front side is etching with an etching composition, such as a buffered oxide etch. Such buffered oxide etches may include one or more inorganic acids in combination with a buffering agent, such as an ammonium compound. Prior to the etching step, a mask which is resistant to the etching activity of the etchant is applied in a pattern negative to that of the sites of the current tracks. After etching the mask is usually removed prior to metallization of the current tracks.

A major problem which often arises during formation of the current tracks is undercutting. This results in defective and inefficient semiconductor devices. This problem is common when the current tracks are formed using an etching method in combination with a mask, also known as an etch resist. Upon application of the etch to the selectively masked semiconductor, the etch may not only remove portions of the antireflective layer not covered by the mask but by capillary action seep under the mask at the interface of the mask and the antireflective layer causing portions of the antireflective layer covered by the mask to be undesirably etched away. This results in current tracks having irregular widths which results in irregular and non-uniform current flow in the final metalized device. In addition, such undercutting may form tributaries which adjoin adjacent current tracks resulting in electrical shorts.

Another problem in the formation of current tracks involves the hydrophilic nature of the surface of the semiconductor wafer. Many conventional masking materials used in the manufacture of photovoltaic devices adhere poorly to hydrophilic surfaces. The more hydrophilic the wafer surface the more compromised is the adhesion of the mask to the wafer surface, thus aggravating undercutting of the mask by the etchant. While monocrystalline and polycrystalline wafers and antireflective layers, in general, tend to be more hydrophobic in nature than hydrophilic, there is still some degree of hydrophilic character which may compromise adhesion of masks to their surfaces. In addition, mono cast wafers, also known as hybrid mono wafers, are becoming more common in the photovoltaic industry. These wafers are combinations of both multicrystalline and monocrystalline silicon. They are becoming more desirable for use in the photovoltaic industry because they have a higher potential efficiency than conventional multicrystalline wafers and are less costly than conventional monocrystalline wafers. However, such mono cast wafers are substantially more hydrophilic than the multicrystalline and monocrystalline wafers and many conventional masks do not adhere to their surfaces to the degree desired to prevent undercutting.

As the industry seeks to manufacture semiconductor devices using thinner and more delicate semiconductor wafers and at the same time increase the plurality of current tracks on the front side of the wafers to increase electrical out-put, the problem becomes compounded by difficulty of working with smaller and more delicate materials. In addition, current tracks with smaller dimensions reduce shadowing. When the semiconductor is used as a means of collecting incident radiation, such as in photovoltaic devices and solar cells, large current tracks may block incident light from impinging on the antireflection layer, thus reducing the amount of incident light which is absorbed by the semiconductor with the result of compromising the efficiency of the photovoltaic device or solar cell. Accordingly, there is a need for a method and etch resist which substantially reduces or eliminates the problem of undercutting in the formation of current tracks on semiconductor wafers and permits the formation of fine line current tracks.

SUMMARY OF THE INVENTION

Methods include providing a doped semiconductor wafer including a front side, a back side, and a pn junction; selectively applying a resist composition on top of the front side of the semiconductor wafer, the resist composition includes one or more hydrogenated rosin resins, the hydrogenated rosin resins are solids at room temperature, one or more hydrogenated rosin resin esters, the hydrogenated rosin resin esters are liquids at room temperature, and one or more fatty acids; and applying an etch composition to the semiconductor to etch away exposed sections of the front side of the semiconductor to form current tracks.

Compositions include one or more hydrogenated rosin resins, one or more hydrogenated rosin resin esters, and one or more fatty acids, the one or more hydrogenated rosin resins are solids at room temperature and the one or more hydrogenated rosin resin esters are liquids at room temperature, the weight ratio of the one or more hydrogenated rosin resins to the one or more hydrogenated rosin resin esters is 2:1 to 4:1.

The methods and compositions enable the formation of a plurality of current tracks on semiconductors which have reduced or no detectable undercutting between the resist composition and the front side of the semiconductor or the antireflective layer on the front side of the semiconductor to which the resist composition is applied. This enables metal current tracks to have uniform dimensions and provides a semiconductor device with uniform current flow and increased electrical out-put in contrast to many conventional semiconductor devices made with conventional methods. Short circuiting of adjacent current tracks due to interconnecting tributaries is reduced or eliminated. The methods and compositions also enable the formation of current tracks with fine line dimensions, thus increasing the plurality of current tracks on a semiconductor as well as enabling the formation of current tracks on smaller sized wafers. Further, by reducing the size of the current tracks undesirable shadowing is reduced or eliminated, thus reducing shadowing and enabling an increase in the absorption of incident light by the semiconductor device. The resists are of such a composition that they provide sufficient adhesion at an interface with the surface of the semiconductor itself or the surface of the antireflective layer to inhibit seepage of the etchant under the resist due to capillary action. In addition, the resists may be readily and rapidly removed from the surface of the semiconductor or antireflective layer by dissolving rather than swelling and lifting using aqueous alkaline solutions without concern that any remaining residue may compromise metal plating or contaminate the final device. This permits easy waste treatment because the dissolved resist may be precipitated out by neutralization. Also, this permits less periodic maintenance on equipment. In addition, the resists have good adhesion to both hydrophilic and hydrophobic surfaces in contrast to many conventional resists which typically show poor adhesion to hydrophilic surfaces.

DETAILED DESCRIPTION OF THE INVENTION

As used throughout this specification, the terms "depositing" and "plating" are used interchangeably. The terms "current tracks" and "current lines" are used interchangeably. The terms "hot melt inkjet resist", "inkjet resist", "etch resist", "resist" and "composition" are used interchangeably. The terms "rosin resin", "resin" and "rosin" are used interchangeably. The indefinite articles "a" and "an" are intended to include both the singular and the plural. The term "selectively depositing" means that deposition of a material occurs in specific desired areas on a substrate. The term "resist" means a composition which is not physically or chemically altered by etchants containing inorganic or organic acids. The term "hydrogenated" means a chemical compound where part or all of its unsaturated chemical bonds (—C=C—) have been chemically treated to break or saturate the bonds with hydrogen (—$CH_2$—$CH_2$—). The term "hydrophilic" means having an affinity for water. The term "hydrophobic" means repelling, tendency not to combine with, or incapable or dissolving in water.

The following abbreviations have the following meanings unless the context clearly indicates otherwise: ° C.=degrees Celsius; g=grams; mg=milligrams; cps=centipoise, 1 cps=1×$10^{-3}$ pascals (Pas)=0.01 poise=1.02×$10^{-4}$ kps/$m^2$; A=amperes; dm=decimeter; µm=microns; nm=nanometers; and UV=ultra violet.

All percentages and ratios are by weight unless otherwise indicated. All ranges are inclusive and combinable in any order except where it is clear that such numerical ranges are constrained to add up to 100%.

Photovoltaics and solar cells may be composed of monocrystalline, polycrystalline or mono cast silicon semiconductor wafers. Silicon wafers typically have a p-type base doping.

The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n++ doped front side increases the conductivity of current lines in contrast to a n+ doped front side. The n-doped region may be referred to as the emitter layer.

An anti-reflective layer may be added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, or a combination of silicon oxide and silicon nitride layers. In the foregoing formulae, x is the number of oxygen atoms, typically x is the integer 2, i.e., silicon dioxide. Such anti-reflective layers may be deposited by a number of techniques, such as by various vapor deposition methods, for example, chemical vapor deposition and physical vapor deposition. While there is no thickness limitation on the silicon oxide and silicon nitride layers, typically, they are 100-200 nm thick.

The hot melt ink resists may be selectively deposited by inkjet printing, aerosol or screen printing. The hot melt ink jet resists are selectively applied to form an image which may be negative to the current tracks or positive to the current tracks. WO 2005/013323 and WO 2005/011979 disclose methods of screen printing resists in the manufacture of photovoltaic devices. Typically, the hot melt ink resists are selectively applied to antireflective layers or doped emitter layers using inkjet printing or aerosol. More typically, they are selectively applied using inkjet printing. Viscosities of the hot melt inkjet resist during application by inkjet printing or aerosol range from 7 cps to 21 cps, preferably from 9 cps to 15 cps. Most preferably the hot melts are applied at viscosities of 10 cps to 12 cps.

The inkjet printing method may be a continuous inkjet method or a drop-on-demand method. The continuous method is a printing method where the direction of the ink resist is adjusted by changing an electromagnetic field while continuously jetting the ink resist using a pump. The drop-on-demand is a method which dispenses the ink resist only when needed on an electronic signal. Drop-on-demand may be divided into a piezoelectric ink jet method where pressure is generated by using a piezoelectric plate causing a mechanical change by electricity and a thermal ink jet method using pressures which are generated by the expansion of bubbles produced by heat.

In contrast to the inkjet printing method, the aerosol method first forms an aerosol of the ink resist. The aerosol is guided to the semiconductor substrate via a pressurized nozzle with the pressurized nozzle being mounted to a print head. The aerosol is mixed with a focusing gas and is transported to the pressurized nozzle in a focused form. The use of focusing gas to dispense the ink resist reduces the probability of clogging the nozzles and also enables the formation of finer current tracks, a greater aspect ratio than with an inkjet apparatus.

The hot melt inkjet resists may be applied adjacent the surface of the antireflective layer or adjacent the surface of the doped emitter layer at temperatures of 95° C. and less, preferably 80° C. to 55° C. Such low inkjet temperatures allow the inks to be used in most inkjet printhead modules. Also, the inkjet resist has longer shelf life under low temperatures. The hot melt inkjet resists rapidly harden after application and adhere to the surface of the antireflective layer or doped emitter layer such that no hardening agents or cross-linking agents are included in the resist compositions. Accordingly, UV application steps and other conventional hardening steps are eliminated from the methods.

Preferably, the doped emitter layer is n++ doped with phosphorus. The n++ doping increases conductivity of the metallized current tracks. While not being bound by theory, such n++ doped current tracks increase electron flow into the current tracks due to the higher positive charge doping. This type of emitter layer is known as a selective emitter layer. The hot melt inkjet resists may also be applied adjacent $SiO_x$ or silicon nitride antireflective coating. The hot melt inkjet resists may be either positive to the current lines or negative to the current lines. When the emitter layer is a selective emitter layer, preferably the resist is positive to the current lines. There are no metal components on the semiconductor substrates at this stage. Although there is no limitation on the thickness of current lines made with the methods, typically, the hot melt inkjet resists are selectively applied to form current lines having widths of 100 μm or less, or such as from 80 μm to 20 μm, or such as from 70 μm to 30 μm.

The hot melt inkjet resists include one or more hydrogenated rosin resins which are solid at room temperature and one or more hydrogenated rosin resin esters which are liquid at room temperature. The weight ratio of the one or more hydrogenated rosin resins to the one or more hydrogenated rosin resin esters is from 2:1 to 4:1, preferably from 2.3:1 to 3.8:1, more preferably from 2.5:1 to 3.3 to 1. The specific amount of the hydrogenated rosin resin and the hydrogenated rosin resin ester may not be critical as long as the amounts of the two components are within the recited weight range ratios and are included in amounts such that the inkjet resist provides the desired adhesion to the semiconductor substrate while inhibiting undercutting.

Rosin resins include fully hydrogenated or partially hydrogenated rosin acids or salts thereof which are derived from rosin acids of the abietic and pimaric types with a general formula $C_{19}H_{29}COOH$ with a phenanthrene nucleus. Isomers include, but are not limited to, levopimaric acid, neoabietic acid, palustric acid, dehydroabietic acid, dihydroabietic acid (3 probable) and tetrahydroabietic acid. Preferably the rosin resins are fully hydrogenated. The average weight molecular weight ranges from 300 to 308, or such as from 302 to 306. The acid number is at least 150, or such as from 155 to 190, or such as from 160 to 180 (mg KOH/g). Rosin is derived from pine trees (chiefly *Pinus palustris* and *Pinus elliotii*). Gum rosin is the residue obtained after distillation of turpentine oil form the oleoresin tapped from living trees. Wood rosin is obtained by extracting pine stumps with naphtha and distilling off the volatile fraction. Tall oil is co-product of the fractionation of tall oil. Hydrogenated rosin resins may be obtained commercially or extracted from their natural sources and refined according to methods disclosed in the literature. An example of a commercially available partially hydrogenated rosin resin is STAYBELITE® A hydrogenated rosin available from Pinova Incorporated. Another commercially available partially hydrogenated rosin resin is STAYBELITE® Resin-E available from Eastman Chemical Company. An example of a commercially available fully hydrogenated rosin is FORAL™ AX-E available from Eastman Chemical Company. In general, hydrogenated rosin resins may be included in the hot melt inkjet resists in amount of 15 wt % to 35 wt %, or such as from 20 wt % to 30 wt %.

The rosin resins typically are those that are described above and they are reacted to form esters with methyl alcohol, triethylene glycol or combinations thereof. In general, the weight average molecular weight of methyl esters is 316-320 and the triethylene glycol esters range from 718 to 726. In general, such rosin esters have low acid numbers of 4-16 mg KOH/g. Methods of forming esters of rosin resins are well known in the art and disclosed in the literature. Examples of commercially available hydrogenated rosin esters are ABALYN® methyl ester of rosin, HERCOLYN® D methyl ester of hydrogenated rosin and HERCOLYN® DW methyl ester of hydrogenated wood rosin and STAYBELITE™ Ester 3-E all available from Pinova, Inc.; ABALYN™ D-E methyl ester of rosin, FORALYN™ 5020-F methyl ester of hydrogenated rosin and METALYN™ 200 methyl ester all available from Eastman Chemical Company; and SYLVATAC™ RE 12, 25 and 40 all available from Arizona Chemical. In general, the rosin esters are included in amounts of 5 wt % to 15 wt % or such as from 7 wt % to 12 wt %.

The hot melt inkjet resists also include one or more fatty acids or salts thereof having a formula $R^1COO$-M where $R^1$ is a linear, branched or cyclic alkyl or alkenyl group having 7 to 48 carbon atoms, preferably 12 to 24 carbon atoms and M is hydrogen or a counterion such as sodium, potassium, calcium ammonium or $NH_y(CH_2CH_2OH)_z$ where y and z are integers from 0 to 4 and their sum is always 4. Such fatty acids include, but are not limited to, caprylic acid, capric acid, lauric acid, linoleic acid, myristic acid, oleic acid, palmitic acid and stearic acid or salts thereof. Typically, the fatty acids are chosen from lauric acid, linoleic acid, myristic acid, palmitic acid, stearic acid and salts thereof. Preferably the fatty acids are chosen from myristic acid, palmitic acid and salts thereof. Such fatty acids and salts thereof have acid numbers of 200 and greater, typically, from 215 to 250 mg KOH/g. Many of the fatty acids or salts thereof may be derived from natural oils, such as marine, rapseed, tallow, tall oil, soy, cottonseed and coconut. Such fatty acids, salts and mixtures are either commercially available or may be manufactured by techniques known in the art. The fatty acids may be included in amounts to make up the balance of the composition. In general, such fatty acids and salts thereof may be included in the hot melt inkjet resists in amounts of at least 55 wt %, or such as from 55 wt % to 80 wt %, or such as from 65 wt % to 75 wt %.

Optionally, the hot melt inkjet resists include one or more optical brighteners. Conventional optical brighteners, such as fluorescent whitening agents, may be used. Such optical brighteners include, but are not limited to, 4,4'-bis[2-(2-methoxyphenyl)ethenyl]-1,1'-biphenyl; 1,4-bis(2-cyano styryl)benzene; 2,2'-(1,4-naphthalenediyl)bisbenzoxazole; 2,2'-(2,5-thiophenediyl)bis[5-(1,1-dimethylethyl)]-benzoxazole; 2,5-thiophenediylbis(5-tert-butyl-1,3-benzoxazole); and 2,2'-(1,2-ethenediyldi-4,1-phenylene)bisbenzoxazole. Examples of commercially available fluorescent white agents are UVITEX™ FP and UVITEX™ OB by Ciba Switzerland and BLANKOPHOR™ ER by Bayer A.G., Germany. Such optical brighteners may be included in the hot melt inkjet resists in amounts of 0.01 wt % to 3 wt % or such as from 0.05 wt % to 0.5 wt %.

The hot melt inkjet resist components are mixed or blended together using conventional methods to provide a hot melt inkjet resist which is substantially a solid at room temperature. The softening points for the resists range from 35° C. to 55° C., typically from 40° C. to 50° C.

The etchant may be applied to the semiconductor substrate with the selectively applied hot melt inkjet resist by any suitable method known in the art. Such methods include immersion of the semiconductor substrate in an etchant bath, selectively applying by inkjet printing, aerosol or using conventional spray apparatus. The etchant is applied at mild temperatures in contrast to many conventional etching processes. The mild temperatures reduce or prevent attack on the resist, thus the inkjet resist maintains its integrity during etching and inhibits undercutting by the etchant. Etch temperatures range from room temperature to 50° C. or such as from 25° C. to 40° C.

The etchant may include one or more inorganic acids and one or more polyols with the balance water. The etchant is applied for a period of 80 seconds or less, typically from 5 seconds to 60 seconds, preferably from 20 seconds to 40 seconds.

Inorganic acids include, but are not limited to, hydrofluoric acid, hydrochloric acid, sulfuric acid, nitric acid and phosphoric acid. Typically the inorganic acids are provided in aqueous form as a concentrated or dilute aqueous solution. Preferably, the inorganic acid is hydrofluoric acid. The inorganic acids may be included in amounts of 1 wt % to 20 wt % of the etchant.

The polyols are water soluble at room temperature and are compatible with inorganic acids such that there are no stability problems. Such polyols include, but are not limited to, glycols, such as polyhydric alcohols, such as ethylene glycol, polyethylene glycol, propylene glycol, polypropylene glycol, butylene glycol, polybutylene glycol, dipropylene glycol, tripropylene glycol, and glycerin. Preferably, the polyol is chosen from ethylene glycol and propylene glycol. Such polyols may be included in the etchant in amounts of 20% by volume to 80% by volume, or such as from 40% by volume to 70% by volume, or such as from 50% by volume to 60% by volume.

In addition to the inorganic acids and polyols, ammonium compounds may also be included in the etchant. Preferably, the etchant includes one or more ammonium compounds. Ammonium compounds include, but are not limited to, ammonium fluoride and ammonium bifluoride. Preferably the ammonium compound is ammonium fluoride. Typically the ammonium compounds are provided as aqueous concentrates or as dilute solutions. Such ammonium compounds may be included in amounts of 10 wt % to 40 wt % of the etchant.

Typically when an ammonium compound is included in the etchant a volume ratio of ammonium compound to inorganic acid varies from 10:1 to 4:1. A preferred etchant is aqueous ammonium fluoride and aqueous hydrogen fluoride at a volume to volume ratio of 10:1 to 4:1 with one or more polyols in amounts of 40% to 60% by volume. The balance of the formulation may be water.

The hot melt inkjet resist inhibits undercutting such that the current lines have substantially uniform widths and substantially no tributary formation with adjacent current lines. The hot melt inkjet resist inhibits capillary action at the interface of the hot melt inkjet resist and doped surface of the emitter layer or the $SiO_x$ or silicon nitride, thus inhibiting undercutting and providing current lines having regular dimensions and efficient current conduction.

When etching is complete, the semiconductor may be rinsed with water to remove any etchant. The hot melt inkjet resist is then stripped from the semiconductor substrate. The acid number for the entire hot melt inkjet resist ranges from at least 180, or such as from 180 to 230, or such as from 185 to 215 mg KOH/g. The hot melt inkjet resist is stripped with a dilute aqueous alkaline solution, such as potassium hydroxide or sodium hydroxide. The hydroxide concentration may range from 0.1 wt % to 5 wt %. Such mild aqueous alkaline solutions are applied at temperatures of from room temperature to 50° C. Stripping is rapid and may take from one minute or less. Stripping of the resist is substantially complete. The resist dissolves from the surface of the doped emitter layer, $SiO_x$ or silicon nitride layer as opposed to lifting or floating as many conventional resists. Minor amounts of residue may be rinsed from the semiconductor with water.

After etching and stripping metallization of the substrate is then done. Prior to front side metallization the back side of the semiconductor wafer is metalized, such as with aluminum, to provide a low resistance wafer. Any conventional method may be used. Typically, the surface resistance, also known as sheet resistance, of the semiconductor wafer may range from 40 to 90 ohms/square.

A layer of metal is then deposited on the front side current lines. Typically a silver paste is applied to the current lines and fired. This may be followed by depositing other metals on the current tracks, such as silver, copper and nickel.

The following examples are included to illustrate various aspects of the invention but are not intended to limit the scope of the invention.

Examples 1-4

Four hot melt inkjet resists having the formulae disclosed in the table below were prepared. The fully hydrogenated rosin resin was a solid and the methyl ester of the fully hydrogenated rosin resin was a liquid at room temperature. The mixture of the components formed a solid hot melt inkjet resist at room temperature.

TABLE 1

| Component | Example 1 | Example 2 | Example 3 | Example 4 |
|---|---|---|---|---|
| Fully hydrogenated rosin resin[1] | 25 wt % | 25 wt % | 25 wt % | 25 wt % |
| Methyl ester of fully hydrogenated rosin resin[2] | 7.5 wt % | 10 wt % | 12.5 wt % | 0 |
| Palmitic acid | 67.5 wt % | 65 wt % | 62.5 wt % | 75 wt % |
| 2,5-thiophenediylbis(5-tert-butyl-1,3-benzoxazole)[3] | 0.05 wt % | 0.05 wt % | 0.05 wt % | 0.05 wt % |

[1]FORAL ™ AX-E Fully Hydrogenated Rosin: tetrahydroabietic acid (available from Eastman Chemical Company), CAS 65997-06-0
[2]HERCOLYN ® D Methyl Ester of Hydrogenated Rosin: hydrogenated methyl abietate (available from Pinova, Inc.), CAS 8050-15-5
[3]UVITEX OB ™: optical brightener, CAS 7128-64-5

Each hot melt was placed in the reservoir of a DoD 300 inkjet printer (obtainable from Schmid GmbH, Freudenstadt, Germany). The temperature in the reservoir was raised to 85° C. to melt the resists. Each resist was selectively printed on the silicon nitride antireflective layers of textured and phosphorus n++ doped multicrystalline silicon wafers (obtained from Q-Cells).

The wafers were held at room temperature for 15 minutes. The line width for each wafer was then measured using a PAXcam digital microscope camera with bundled PAX-it image analysis software from MIS, Inc. (Surgoinsville, Tenn., U.S.A.). The line width was measured across the edges of the resist deposit.

Each wafer was then etched using an aqueous 20% hydrofluoric acid solution at 30° C. for 90 seconds. The hydrofluoric acid etched away sections of the silicon nitride antireflective layer which was not covered by the resist. The wafers were then removed from the etch solution and rinsed with water at room temperature to remove etchant and etching residue.

The line width of the wafers after stripping was determined using the PAXcam digital microscope camera with bundled PAX-it image analysis software. The undercut per side was determined by (line width before etching−line width after etching)/2. The undercut for Example 1 was 17-20 µm/side, Example 2 was 13-15 µm/side, Example 3 was 7-10 µm/side and Example 4 was 33-35 µm/side. Example 4 which did not include the liquid rosin resin showed the largest undercut. In contrast, the resists which included the liquid rosin resin in combination with the solid rosin resin had reduced or improved undercutting results than the resist which did not include the liquid rosin resin and solid rosin resin mixture.

Example 5

The following hot melt inkjet resist was prepared. The fully hydrogenated rosin was a solid at room temperature and the methyl ester of partially hydrogenated rosin was a liquid at room temperature. The mixture of all of the components in Table 2 below formed a solid hot melt inkjet resist at room temperature.

TABLE 2

| COMPONENT | AMOUNT |
|---|---|
| Palmitic acid | 65 wt % |
| FORAL ™ AX-E fully hydrogenated rosin | 25.5 wt % |
| HERCOLYN ® D methyl ester of partially hydrogenated rosin | 9 wt % |
| 2,5-thiophenediylbis(5-tert-butyl-1,3-benzoxazole) | 0.5 wt % |

The hot melt inkjet resist was placed in the reservoir of a DoD 300 inkjet printer (from Schmid GmbH, Freudenstadt, Germany). The temperature in the reservoir was raised to 85° C. to melt the resist. The resist was selectively printed on the surface of a hydrophobic, textured, phosphorus n++ doped emitter layer of a multicrystalline silicon wafer (obtained from Q-Cells) to form a selective emitter pattern on the wafer. The resist was positive to the conductor tracks.

The wafer with the resist was held at room temperature for 15 minutes. The line width for the wafer was then measured using the PAXcam digital microscope camera with bundled PAX-it image analysis software. The measurement was done before phosphorus glass (PSG) removal. This provided a dark color contrast to provide accurate line width measurements. The line width was measured across the edges of the resist deposit. The line width measurements ranged from 490-550 µm.

The wafer was then etched using an aqueous mixture of 15-25 g/L hydrofluoric acid and 250-350 g/L nitric acid solution at 6-15° C. for 60-80 seconds. The aqueous acid mixture etched away sections of the n++ doped emitter layer including PSG which was not covered by the resist. The wafer was then removed from the etch solution and rinsed with water at room temperature to remove etchant and etching residue.

The line width of the wafer after etching was determined using the PAXcam digital microscope camera with bundled PAX-it image analysis software. The line width measurements ranged from 470-540 µm. The decrease in width was due to the etchant undercutting the hot melt resist. The undercut was determined to be 5-10 µm/side.

The foregoing procedure was repeated using the same type of textured and doped multicrystalline wafer except the hot melt inkjet resist was a stearic acid resist. This control resist was obtained from Sun Chemical. The line width range prior to etching was measured to be from 460-520 µm. After etching the line width range was measured to be 440-490 µm. The undercut ranged from 10-15 µm. The results showed that the formulation in Table 2 above which included the mixture of the solid and liquid rosin resins had reduced undercut in comparison to the control resist.

Example 6

The procedure described in Example 5 was repeated except that the wafers used were mono cast or hybrid mono wafers. The wafers were textured and had phosphorus n++ doped emitter layers on their front side. The wafer surfaces were hydrophilic. Before etching the line widths of the wafer which included the resist having the formulation in Table 2 above ranged from 490-550 µm and the control resist had line widths from 460-520 µm. After etching the line widths of the wafer with the resist of the formulation in Table 2 ranged from 470-520 µm. The line widths for the control after etching ranged from 420-460 µm. The undercut for the resist of the formulation in Table 2 was 10-15 µm/side and the control resist had an undercut of 20-30 µm/side. The results showed that the resist which included a mixture of both the solid and liquid rosin resins had reduced undercut in contrast to the control resist.

What is claimed is:

1. A method comprising:
   a) providing a doped semiconductor wafer comprising a front side, a back side, and a pn junction;
   b) selectively applying a resist composition on top of the front side of the semiconductor wafer, the resist composition comprises one or more hydrogenated rosin resins, the hydrogenated rosin resins are solids at room temperature, one or more hydrogenated rosin resin esters, the hydrogenated rosin resin esters are liquids at room temperature, wherein a weight ratio of the one or more hydrogenated rosin resins to the one or more hydrogenated rosin resin esters is 2:1 to 4:1 and one or more fatty acids; and
   c) applying an etch composition to the semiconductor to etch away exposed sections of the front side of the semiconductor to form current tracks.

2. The method of claim 1, wherein the front side of the semiconductor further comprises an antireflective layer.

3. The method of claim 1, wherein the hydrogenated rosin resin is derived from abietic acid or pimaric acid.

4. The method of claim 1, wherein the hydrogenated rosin resin ester is derived from abietic acid or pimaric acid.

5. The method of claim 1, wherein an emitter layer of the front side of the semiconductor wafer is n++ doped.

6. The method of claim 1, wherein the semiconductor wafer is a mono cast wafer, monocrystalline wafer or a polycrystalline wafer.

* * * * *